United States Patent [19]
Ishibashi

[11] Patent Number: 5,630,106
[45] Date of Patent: May 13, 1997

[54] DRAM CONTROLLER INCLUDING BUS-WIDTH SELECTION AND DATA INVERSION

[75] Inventor: Shohzoh Ishibashi, Chigasaki, Japan

[73] Assignee: Ricoh Company, Ltd., Tokyo, Japan

[21] Appl. No.: 127,946

[22] Filed: Sep. 27, 1993

[30] Foreign Application Priority Data

Sep. 29, 1992 [JP] Japan ................... 4-283898

[51] Int. Cl.⁶ ........................................... G06F 12/00
[52] U.S. Cl. .................. 395/521; 395/510; 395/518; 395/524; 345/185; 345/189; 345/201
[58] Field of Search ........................ 395/115, 116, 395/162, 164, 165, 166, 405, 427, 431, 432, 481, 306, 307, 311; 345/185, 186, 189, 190, 200, 201; 365/189.01, 189.02, 189.11

[56] References Cited

U.S. PATENT DOCUMENTS

| | | | |
|---|---|---|---|
| 4,766,570 | 8/1988 | Yamaguchi et al. | 365/189 |
| 5,055,661 | 10/1991 | Gochi | 365/189.02 |
| 5,283,877 | 2/1994 | Gastinel | 395/432 |
| 5,307,320 | 4/1994 | Farrer | 395/432 |
| 5,450,342 | 9/1995 | Kimura | 365/189.01 |

FOREIGN PATENT DOCUMENTS

| | | | |
|---|---|---|---|
| 2008669 | 11/1990 | Canada | G06F 13/16 |
| 0188059 | 10/1985 | European Pat. Off. | G11C 7/00 |
| 0156316 | 10/1985 | European Pat. Off. | G11C 8/00 |
| 0163209 | 12/1985 | European Pat. Off. | G06F 5/00 |
| 0218523 | 9/1986 | European Pat. Off. | G06F 9/34 |
| 0385389 | 9/1990 | European Pat. Off. | G11C 7/00 |
| 2225657 | 12/1989 | United Kingdom | G11C 7/06 |
| 2222471 | 3/1990 | United Kingdom | G06F 13/40 |

Primary Examiner—Kee M. Tung
Assistant Examiner—M. Chauhan
Attorney, Agent, or Firm—Cooper & Dunham LLP

[57] ABSTRACT

A DRAM is constructed by a memory section, a multiplexer (MPX), an inverting circuit and a non-inverting circuit. The memory section stores data transferred through a data bus. The multiplexer selects a width of the data bus based on a mode signal for designating the bus width. The mode signal is shown by a MODE0 signal. The inverting circuit inverts writing data and/or reading data based on a mode signal for designating inversion of data. This mode signal is shown by a MODE1 signal. The non-inverting circuit stops transmission of non-inverted data at an inverting time and passes or transmits data at a non-inverting time on the basis of the MODE1 signal. In this structure, a plurality of access methods can be used with respect to a single DRAM so that extendability of the DRAM is improved and a high speed access operation is performed. Further, it is possible to cope with reverse logics of white data with respect to data of YMC (yellow, magenta, cyan) and RGB (red, green, blue) by a simplified circuit structure and a short processing time. A controller using this DRAM is also shown.

6 Claims, 7 Drawing Sheets

DRAM CONTROLLER INCLUDING BUS-WIDTH SELECTION AND DATA INVERSION

BACKGROUND OF THE INVENTION

1. Field of the Invention

The present invention relates to a DRAM (dynamic random access memory) for a page memory and a controller used in a printer for a color multivalued image, a scanner for a color multivalued image, etc.

2. Description of the Related Art

A controller used in a printer for a color multivalued image, a scanner for a color multivalued image, etc. generally has a DRAM (dynamic random access memory) for a page memory within this controller. The controller has a large-sized circuit structure to transfer data at a high speed and perform complicated control operations according to various kinds of operating modes.

As mentioned above, various kinds of operating modes are required for the controller. For example, when an object unit is constructed by a printer, there is an operating mode in which output processing of data transmitted to the printer is performed and three primary colors of yellow, magenta and cyan (YMC) of light are used as color objects and data of these three primary colors are simultaneously transmitted in a data transfer method. In contrast to this, when the object unit is constructed by a scanner, there is another operating mode in which input processing of data transmitted to the scanner is performed and different three primary colors of red, green and blue (RGB) of light are used as color objects and data of these three primary colors are transferred every one color in a data transfer method.

A memory (DRAM) having a large capacity is required for this controller. For example, this memory has the following contents.

| paper size | A3 | A3 |
| image density | 400 dpi | 400 dpi |
| gradation | $2^2$ values | $2^8$ values |
| color data | 32 MB | 128 MB |

In this case, the color data are provided in the case of YMCK.

However, in the general DRAM for a page memory and the general controller for each of a printer and a scanner, the width of a data bus of the used DRAM is fixedly set. Therefore, a using method of the DRAM is fixed so that there is a problem of low extendability that this DRAM cannot be easily used in an extended way. For example, when a DRAM of 32 MB (constructed by 16 DRAMs of 15M bits) is mounted, it is possible to select a first access method for providing size A3 and color gradation of $2^2$ values, and a second access method for providing size A5 and color gradation of $2^8$ values. In the first access method, color data are accessed in a unit of 2 bits every color. In the second access method, color data are accessed in a unit of 8 bits every color. When the first or second access method is selected, it is impossible to use the DRAM in another access method.

Further, since the width of a data bus of the used DRAM is fixedly set, it is necessary to dispose a complicated bus-converting circuit for performing a high speed access operation by using a two-bank interleaving method. In the two-bank interleaving method, the DRAM is physically divided into two memory sections and data of these two memory sections are alternately accessed.

As mentioned above, three primary colors (YMC) of light or different three primary colors (RGB) of light are used. In the case of YMC, white color is provided when all color data show value "0". In contrast to this, in the case of RGB, white color is provided when all color data show value "1". Accordingly, logics of the white data are reverse to each other in the cases of YMC and RGB. Therefore, processings corresponding to the reverse logics of the white data such as clear processing of DRAM data, etc. are performed by using software, thereby increasing a processing time of the DRAM.

SUMMARY OF THE INVENTION

It is therefore a first object of the present invention to provide a DRAM and a controller in which a plurality of access methods can be used with respect to a single DRAM so that extendability of the DRAM is improved and a high speed access operation is performed.

A second object of the present invention is to provide a DRAM and a controller in which it is possible to cope with reverse logics of white data with respect to data of YMC (yellow, magenta, cyan) and RGB (red, green, blue) by a simplified circuit structure and a short processing time.

In accordance with a first structure of the present invention, the above first object can be achieved by a DRAM comprising bus-width selecting means for selecting the width of a data bus on the basis of a mode signal for designating the bus width.

In accordance with a second structure of the present invention, the above second object can be achieved by a DRAM comprising inverting means for inverting writing data and reading data on the basis of a mode signal for designating inversion of data.

In accordance with a third structure of the present invention, the above first object can be also achieved by a controller comprising n-DRAMs each having bus-width selecting means for selecting the width of a data bus on the basis of a mode signal for designating the bus width where n is a positive integer; a first buffer for inputting and outputting data with respect to the n-DRAMs; a second buffer for inputting and outputting data with respect to the n-DRAMs; and access switching means for switching first and second access operations by controlling a setting operation of the mode signal and selection of an accessed DRAM; the controller being constructed such that bus-width full data as $2^N$ data of one DRAM among the n-DRAMs are accessed through the first buffer in the first access operation where N is a non-negative integer; and data of m-DRAMs ($m \leq n$) extended with the data bus of each of the DRAMs as one bit are accessed through the second buffer in the second access operation where m is a positive integer.

In accordance with a fourth structure of the present invention, the above second object can be also achieved by a controller comprising DRAMs each having inverting means for inverting writing data and reading data on the basis of a mode signal for designating inversion of data; and inverting control means for writing value "0" to all the DRAMs by positive logic by controlling the mode signal when a page memory is cleared; the inverting control means processing color data by the positive logic as it is in the case of YMC and logically inverting color data in the case of RGB.

In accordance with a fifth structure of the present invention, the above second object can be also achieved by a controller comprising a DRAM having first inverting means for inverting writing data and reading data on the basis of a mode signal for designating inversion of data; a pull-up resistor for pulling-up output data of the DRAM; second inverting means for inverting the pulled-up output data of the DRAM; and inverting control means for inverting and outputting the output data of the DRAM by controlling the mode signal when no YMC-data are read from the DRAM.

In accordance with a sixth structure of the present invention, the above first object can be also achieved by a controller having n-DRAMs where n is a positive integer, the controller comprising n-bus-width selecting means respectively arranged with respect to the n-DRAMs to select the width of a data bus; a first buffer for inputting and outputting data with respect to the n-DRAMs; a second buffer for inputting and outputting data with respect to the n-DRAMs; and access switching means for switching first and second access operations by selecting the data bus width through the bus-width selecting means; the controller being constructed such that bus-width full data as $2^N$ data of one DRAM among the n-DRAMs are accessed through the first buffer in the first access operation where N is a non-negative integer; and data of m-DRAMs (m≦n) extended with the data bus of each of the DRAMs as one bit are accessed through the second buffer in the second access operation where m is a positive integer.

In accordance with a seventh structure of the present invention, the above second object can be also achieved by a controller having DRAMs, comprising inverting means for inverting writing data and reading data with respect to each of the DRAMs; and inverting control means for writing value "0" to all the DRAMs by positive logic by controlling an operation of the inverting means when a page memory is cleared; the inverting control means processing color data by the positive logic as it is in the case of YMC and logically inverting color data in the case of RGB.

In accordance with an eighth structure of the present invention, the above second object can be also achieved by a controller comprising a DRAM; first inverting means for inverting writing data and reading data with respect to the DRAM; a pull-up resistor for pulling-up output data of the DRAM; second inverting means for inverting the pulled-up output data of the DRAM; and inverting control means for inverting and outputting the output data of the DRAM by controlling an operation of the first inverting means when no YMC-data are read from the DRAM.

In the first structure of the DRAM in the present invention, the bus-width selecting means switches a data bus width on the basis of a mode signal inputted from the exterior of the DRAM such that the data bus width is set to 1 bit, 2 bits, 4 bits, 8 bits, according—to $2^N$ where N is a non-negative integer.

In the second structure of the present invention, the inverting means inverts writing data and reading data based on a mode signal inputted from the exterior of the DRAM.

In each of the third and sixth structures of the present invention, the access switching means switches first and second access operations by controlling a setting operation of the mode signal and selection of an accessed DRAM. In the first access operation, bus-width full data as $2^N$ data of one DRAM among the n-DRAMs are accessed through the first buffer where N is a non-negative integer. In the second access operation, data of m-DRAMs (m≦n) extended with the data bus of each of the DRAMs as one bit are accessed through the second buffer where m is a positive integer.

In each of the fourth and seventh structures of the present invention, the inverting control means writes value "0" to all the DRAMs by positive logic by controlling the mode signal when a page memory is cleared. The inverting control means processes color data by the positive logic as it is in the case of YMC and logically inverts color data in the case of RGB.

In each of the fifth and eighth structures of the present invention, the inverting control means inverts and outputs output data of the DRAM by controlling the mode signal when no YMC-data are read from the DRAM.

In these structures, a plurality of access methods can be used with respect to a single DRAM so that extendability of the DRAM is improved and a high speed access operation is performed. Further, it is possible to cope with reverse logics of white data with respect to data of YMC (yellow, magenta, cyan) and RGB (red, green, blue) by a simplified circuit structure and a short processing time.

Further objects and advantages of the present invention will be apparent from the following description of the preferred embodiments of the present invention as illustrated in the accompanying drawings.

DESCRIPTION OF THE PREFERRED EMBODIMENTS

The preferred embodiments of a DRAM and a controller in the present invention will next be described in detail in an order of first and second embodiments with reference to the accompanying drawings.

Figure 1:
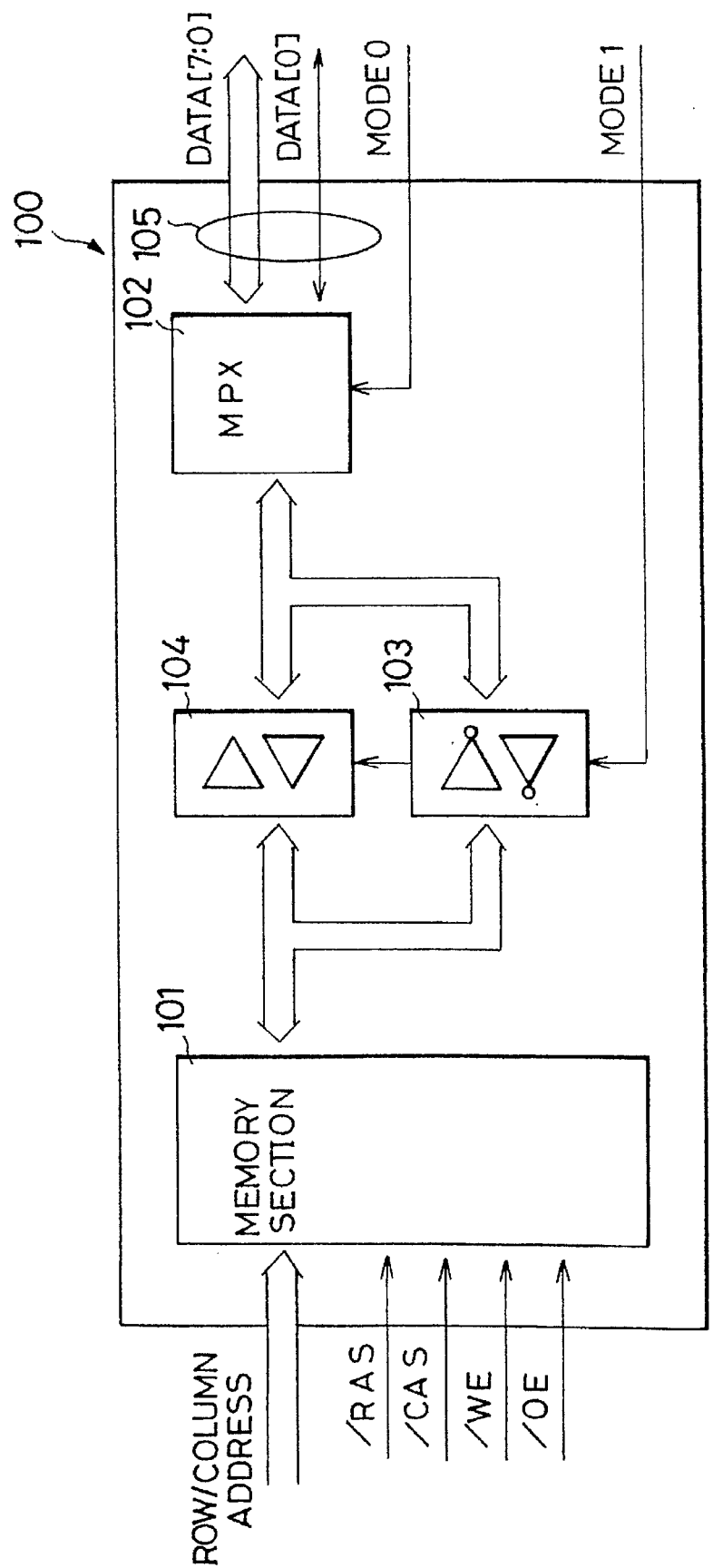
FIG. 1 is an explanatory view showing the construction of a DRAM in accordance with a first embodiment of the present invention.

FIG. 1 shows the construction of a DRAM (dynamic random access memory) 100 in accordance with a first embodiment of the present invention. The DRAM 100 is constructed by a memory section 101, a multiplexer (MPX) 102, an inverting circuit 103 and a non-inverting circuit 104. The memory section 101 stores data transferred through a data bus 105. The multiplexer 102 selects a width of the data bus 105 based on a mode signal for designating the bus width. The mode signal is shown by a MODE0 signal in the following description. The inverting circuit 103 inverts writing data and reading data based on a mode signal for designating inversion of data. This mode signal is shown by a MODE1 signal in the following description. The non-inverting circuit 104 stops transmission of non-inverted data at an inverting time and passes or transmits data at a non-inverting time on the basis of the MODE1 signal.

The multiplexer 102 selects the data width of the data bus 105 by the MODE0 signal as follows such that data are constructed by one bit or 8 bits.

MODE0=0 DATA=DATA [7:0] (8 bits)
MODE0=1 DATA=DATA [0] (1 bit)

The inverting circuit 103 and the non-inverting circuit 104 are switched by the MODE1 signal so that writing data and reading data respectively written and read from the memory section 101 can be selected by inversion and non-inversion.

MODE1=0 DATA=DATA (non-inversion)
MODE1=1 DATA=!DATA (inversion)

Figure 2:
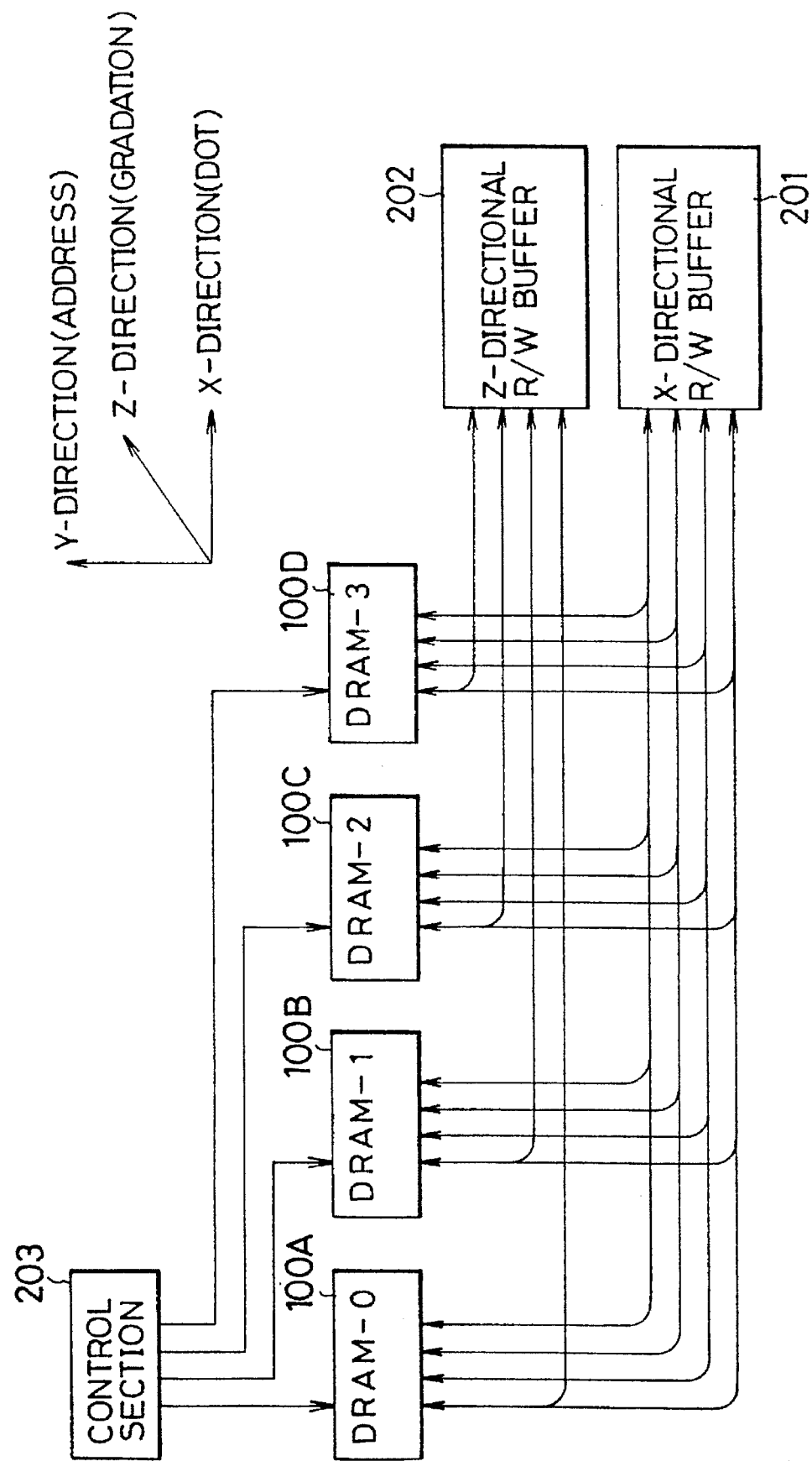
FIG. 2 is an explanatory view showing the construction of a controller in the first embodiment of the present invention.

FIG. 2 shows the construction of a controller in the first embodiment. FIG. 2 shows only a constructional portion of the controller relative to the present invention. The controller in the first embodiment has four DRAMs 100A to 100D, an X-directional R/W buffer 201, a Z-directional R/W buffer 202 and a control section 203. Each of the DRAMs 100A to 100D is equal to the DRAM 100 shown in FIG. 1. The X-directional R/W buffer 201 is used to input and output data to each of the DRAMs 100A to 100D. The Z-directional R/W buffer 202 is used to input and output data to each of the DRAMs 100A to 100D. The control section 203 controls an operation for setting a mode signal such as the MODE0 signal and the MODE1 signal and controls selection of an accessed DRAM. In this embodiment, an X-direction shows a dot. A Y-direction shows an address and a Z-direction shows a gradation.

An operation of the above controller will next be described. The control section 203 controls an operation for setting a mode signal such as the MODE0 signal and the MODE1 signal and controls the selection of an accessed DRAM. Thus, in a first access operation, bus-width full data ($2^N$ data) of one DRAM among the four DRAMs are accessed through the X-directional R/W buffer 201. In a second access operation, data of m ($m \leq n$) DRAMs extended with a data bus of each of the DRAMs as one bit are accessed through the Z-directional R/W buffer 202. The control section 203 switches the first and second access operations by controlling the above mode signal setting operation and the above DRAM selection.

For example, in the first access operation, the width of the data bus of each of the DRAMs 100A to 100D is set to 4 bits by control of the control section 203 when MODE0=0. When a DRAM 100B is further designated by a control signal for designating an accessed DRAM, data of the DRAM 100B among the DRAMs 100A to 100D are accessed through the X-directional R/W buffer 201. In this embodiment, the four DRAMs are arranged, but the present invention is not especially limited to the four DRAMs. Data are extended in a unit of four dots by extending the DRAMs so that it is effective to treat a bit map of binary data. It is also possible to make a bit map suitable for a case in which gradation data are processed as a packed pixel.

In the second access operation, the width of the data bus of each of the DRAMs 100A to 100D is set to one bit by control of the control section 203 when MODE0=1. When four DRAMs are further designated by a control signal for designating an accessed DRAM, data of four DRAMs 100A to 100D as the four DRAMs are accessed through the Z-directional R/W buffer 202. In this case, extension of the DRAMs results in extension of gradation in one frame unit so that it is effective to use the DRAM data as a bit map of multivalued data.

According to another embodiment of the present invention, a plurality of buffers can be provided. For example, data in the X and Z directions can be simultaneously accessed by arranging X-directional R/W buffers 201 such that the number of X-directional R/W buffers 201 is equal to the number of DRAMs. Concretely, the width of the data bus of each of the DRAMs 100A to 100D is set to 4 bits by control of the control section 203 when MODE0=0. Further, four DRAMs are designated by the control signal for designating an accessed DRAM. Thus, data of four DRAMs 100A to 100D as the designated four DRAMs are accessed through four X-directional R/W buffers 201. In this case, it is effective to develop monochromatic font data at a high speed.

Figure 3:
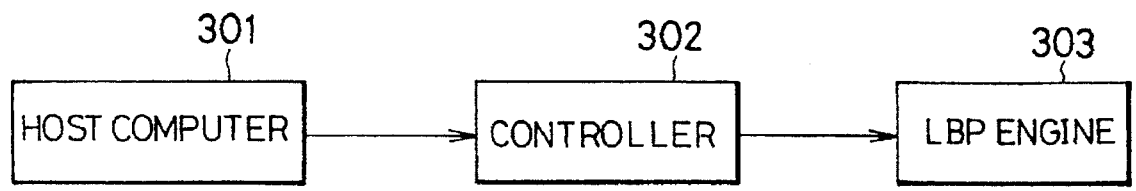
FIG. 3 is an explanatory view showing an example in which the controller shown in FIG. 2 is used as a printer controller.

FIG. 3 shows an example in which the controller shown in FIG. 2 is used as a printer controller. A controller 302 receives code data from a host computer 301 such as a personal computer, etc. There is a case in which the code data include image data, graphic data, etc. The controller 302 changes these code data to a bit map image and transmits data of the bit map image to an LBP engine 303 as an image forming engine.

At this time, when data of both RGB (red, green, blue) and YMC (yellow, magenta, cyan) are processed in color data processing, clearing operations of a bit map image memory (i.e., a DRAM) are different from each other in the RGB and YMC cases. Namely, in the case of RGB, white color is provided in the clearing operation when all DRAM data show value "1". In contrast to this, in the case of YMC, white color is provided in the clearing operation when all DRAM data show value "0". Accordingly, when RGB and YMC modes are changed in delimitation of pages, a page clearing operation is again required so that it takes time to perform the page clearing operation. For example, when the bit map image memory (DRAM) having 128 MB is mounted, entire processing of the DRAM is greatly influenced by only a time for performing the page clearing operation. For example, when it takes a time of 20 nsec with respect to one byte, a time required to perform the page clearing operation with respect to 128 MB is equal to about 2.5 sec.

The DRAM 100 shown in FIG. 1 is used in the first embodiment. Accordingly, when the memory section 101 as a page memory is cleared, value "0" is written to all DRAMs by positive logic by control of the MODE1 signal using the control section 203. In the case of YMC, YMC color data are processed in the positive logic as it is. In contrast to this, the positive logic is inverted in the case of RGB. Accordingly, it is possible to cope with a situation in which logics of white data with respect to YMC-data and RGB-data are reverse to each other, thereby reducing a data processing time of the DRAM.

Figure 4:
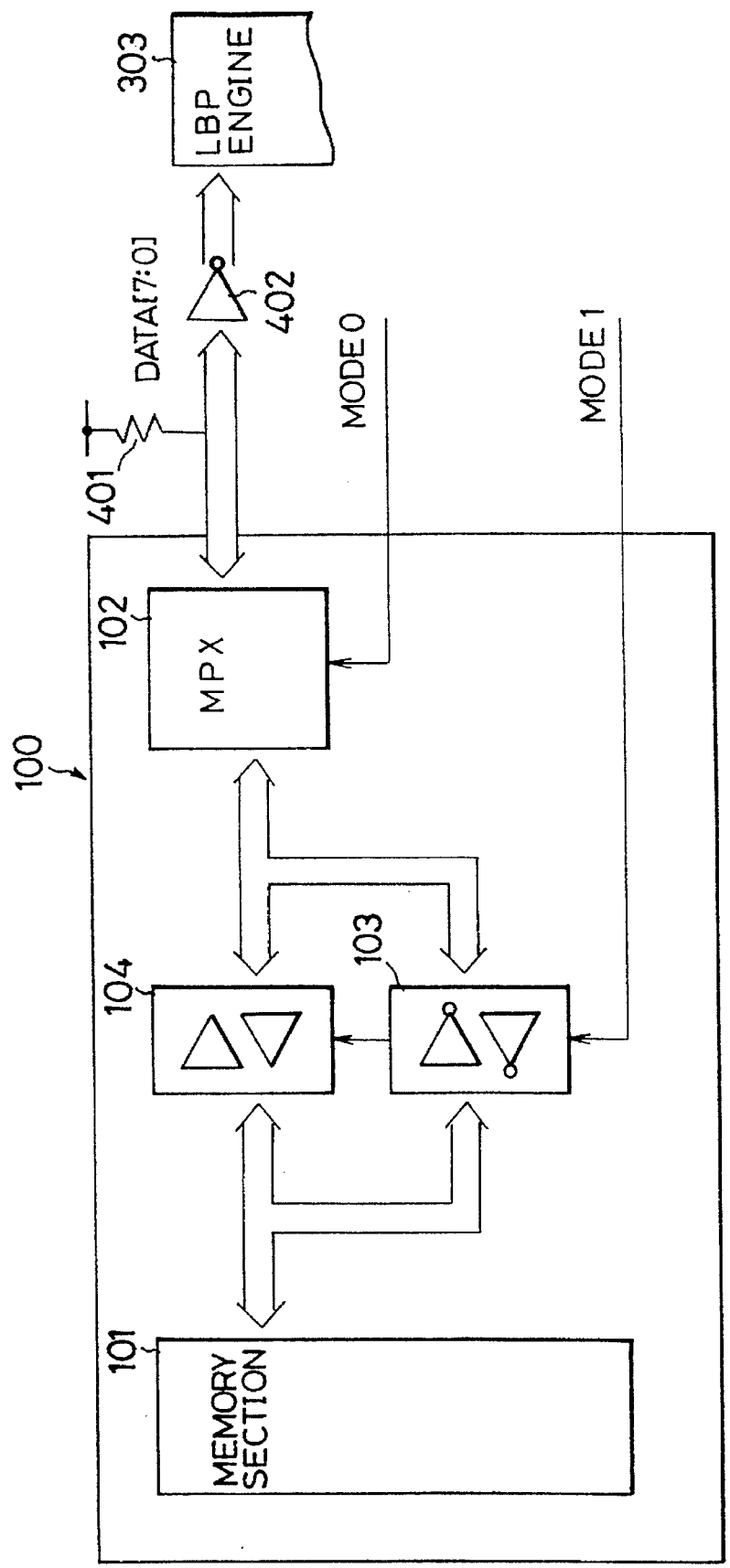
FIG. 4 is an explanatory view showing a method for transmitting data to an LBP engine in the first embodiment.

There are two methods for transmitting data to the LBP engine 303 shown in FIG. 3. In a first method, a signal indicative of an effective data region is transmitted to this effective data region in parallel with these data. In a second method, only data in the effective data region are transmitted to the LBP engine 303 and white data are transmitted to the LBP engine 303 except for the effective data region. In the second method, a data control operation is simplified, but a problem is caused when the logics of white data with respect to YMC-data and RGB-data are reverse to each other in the case of colors as mentioned above. Therefore, the controller shown in FIG. 4 has a pull-up resistor 401 for pulling-up output data of a DRAM 100 and has an inverting circuit 402 for inverting the pulled-up output data. The output data of the DRAM 100 are inverted and outputted by control of a MODE1 signal using the control section 203 when no YMC-data are read from the DRAM 100.

A data bus of the DRAM 100 is normally wired-OR-connected so that this data bus has high impedance when no data are read from the DRAM 100. Further, this data bus is pulled up by the pull-up resistor 401 so that this data bus logically shows value "1".

Value "0" shows white color with respect to all the YMC-data. When no data are read from the DRAM 100, white color can be provided by inverting the output data of the DRAM 100 and again inverting these output data by the inverting circuit 402 until a front stage of video output data transmitted to the LBP engine 303.

A controller in accordance with a second embodiment of the present invention will next be described.

Figure 5:
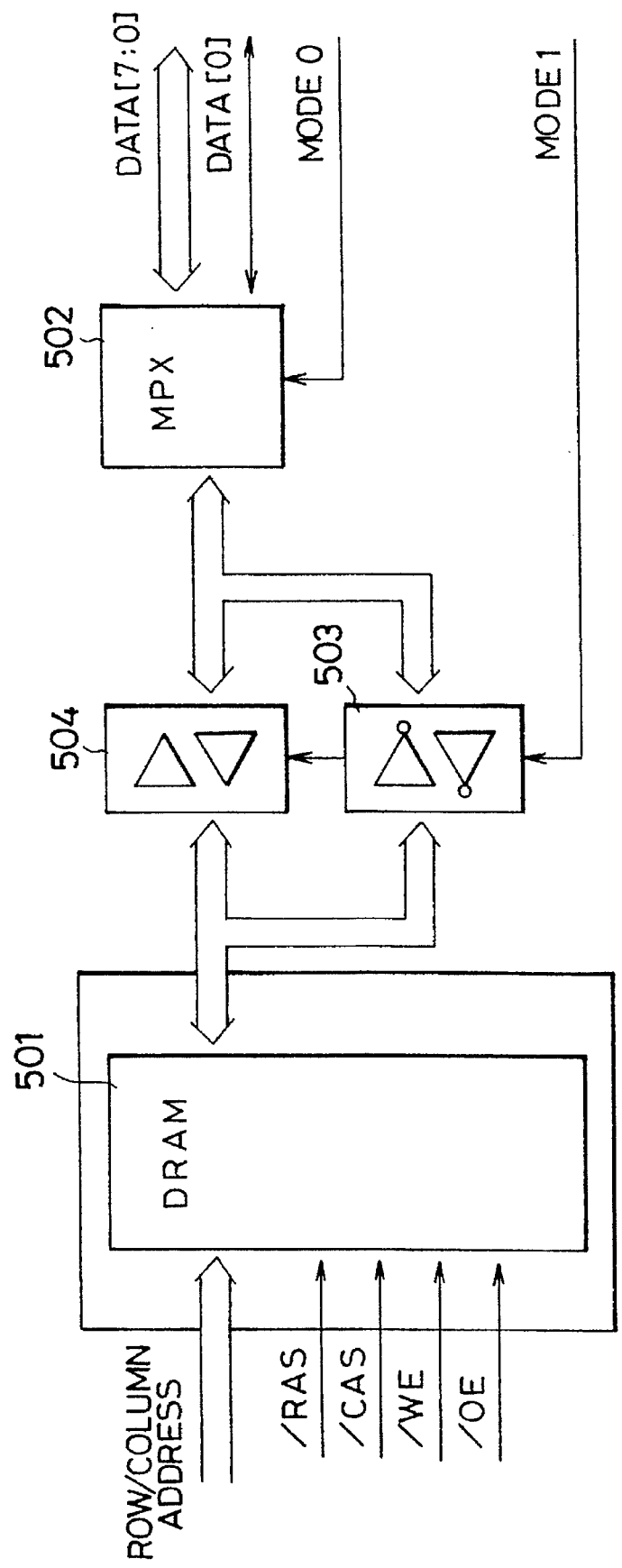
FIG. 5 is an explanatory view showing the construction of a controller in accordance with a second embodiment of the present invention.

As shown in FIG. 5, the controller in the second embodiment has a DRAM 501 as a general DRAM, a multiplexer (MPX) 502, an inverting circuit 503 and a non-inverting circuit 504. The DRAM 501 is used instead of the DRAM 100 in the first embodiment. The multiplexer (MPX) 502 is arranged outside the DRAM 501. The inverting circuit 503 inverts writing data and reading data based on a mode signal for designating inversion of data. In this embodiment, the mode signal is set to a MODE1 signal. The non-inverting circuit 504 stops transmission of non-inverted data at an inverting time and passes or transmits data at a non-inverting time on the basis of the MODE1 signal.

Figure 6:
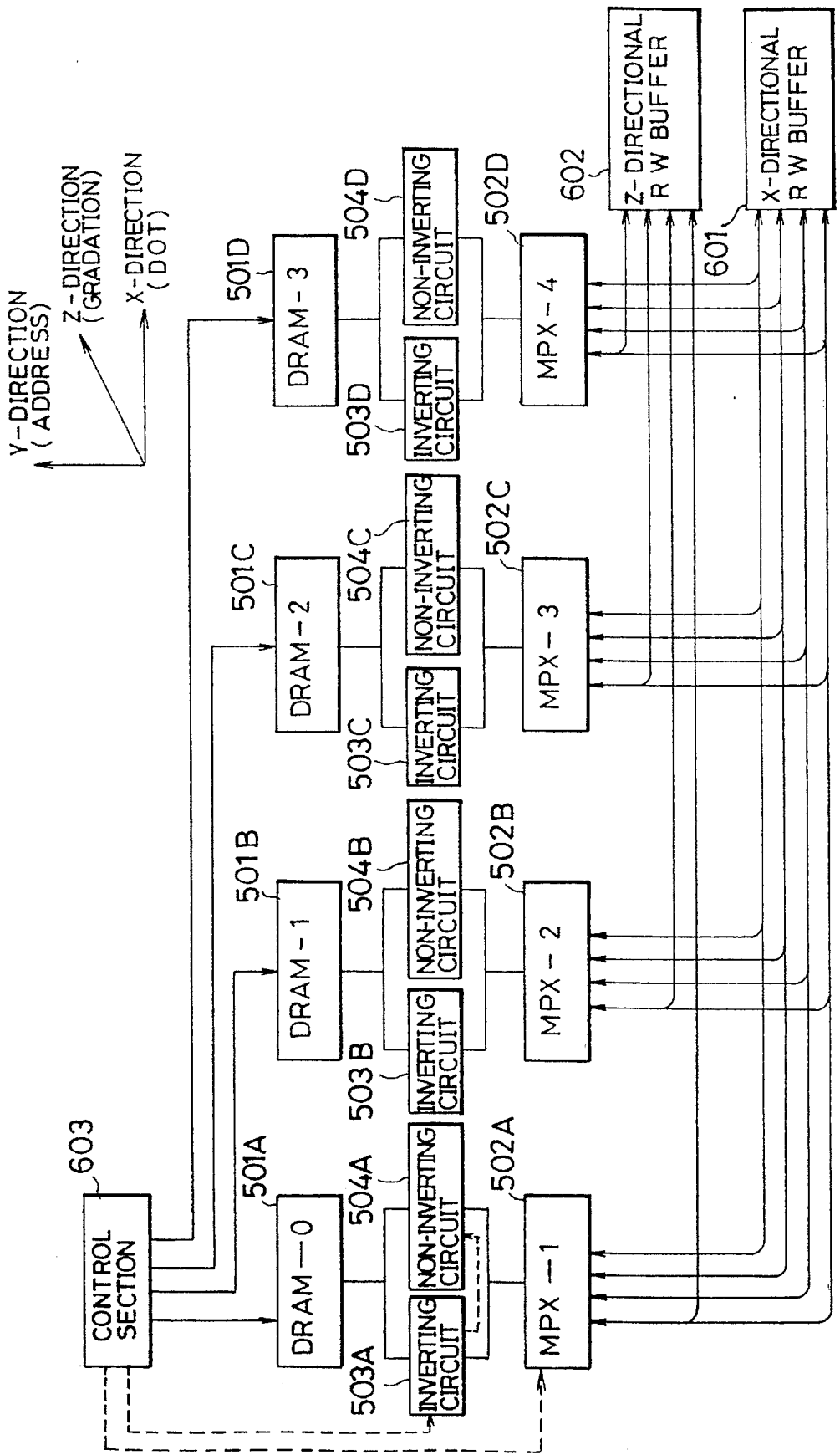
FIG. 6 is an explanatory view showing a detailed construction of the controller in the second embodiment of the present invention.

FIG. 6 shows a detailed construction of the controller in the second embodiment. FIG. 6 shows only a constructional portion of the controller relative to the present invention. The controller in the second embodiment has four DRAMs 501A to 501D, four multiplexers 502A to 502D, an X-directional R/W buffer 601, a Z-directional R/W buffer 602 and a control section 603. The four multiplexers 502A to 502D are respectively arranged to select a data bus width with respect to the four DRAMs 501A to 501D. The X-directional R/W buffer 601 is disposed to input and output data with respect to the DRAMs 501A to 501D. The Z-directional R/W buffer 602 is also disposed to input and output data with respect to the DRAMs 501A to 501D. The control section 603 controls an operation for setting a mode signal such as MODE0 and MODE1 signals and controls selection of an accessed DRAM. In this second embodiment, an X-direction shows a dot. A Y-direction shows an address and a Z-direction shows a gradation.

An operation of the above controller will next be described. The control section 603 controls the setting operation of a mode signal such as MODE0 and MODE1 signals and controls the selection of an accessed DRAM. Thus, in a first access operation, bus-width full data ($2^N$ data) of one DRAM among the four DRAMs are accessed through the X-directional R/W buffer 601. In a second access operation, data of m (m≦n) DRAMs extended with a data bus of each of the DRAMs as one bit are accessed through the Z-directional R/W buffer 602. The control section 603 switches the first and second access operations by controlling the above mode signal setting operation and the above DRAM selection. The control section 603 transmits a control signal for designating an accessed DRAM among the DRAMs 501A to 501D. The control section 603 also transmits a MODE0 signal to each of the multiplexer 502A to 502D. The control section 603 further transmits a MODE1 signal to each of inverting circuits 503A to 503D and each of non-inverting circuits 504A to 504D. For example, in a first access operation, MODE0=0 is transmitted to each of the multiplexers 502A to 502D and the width of a data bus of each of the DRAMs 501A to 501D is set to 4 bits by control of the control section 603. When the control section 603 transmits a control signal for designating an accessed DRAM to the DRAMs 501A to 501D and a DRAM 501A is designated, data of the DRAM 501A among the DRAMs 501A to 501D are accessed through the X-directional R/W buffer 601.

In a second access operation, MODE0=1 is transmitted to each of the multiplexers 502A to 502D and the width of a data bus of each of the DRAMs 501A to 501D is set to one bit by control of the control section 603. When the control section 603 transmits a control signal for designating an accessed DRAM to the DRAMs 501A to 501D and four DRAMs are designated, data of the DRAM 501A to 501D as the designated four DRAMs are accessed through the Z-directional R/W buffer 602.

According to another embodiment of the present invention, a plurality of buffers can be provided. For example, when X-directional R/W buffers 601 can be arranged such that the number of X-directional R/W buffers 601 is equal to the number of DRAMs. In this case, data data in the X and Z directions can be simultaneously accessed.

In such access operations, effects similar to those in the controller in the first embodiment can be obtained.

Figure 7:
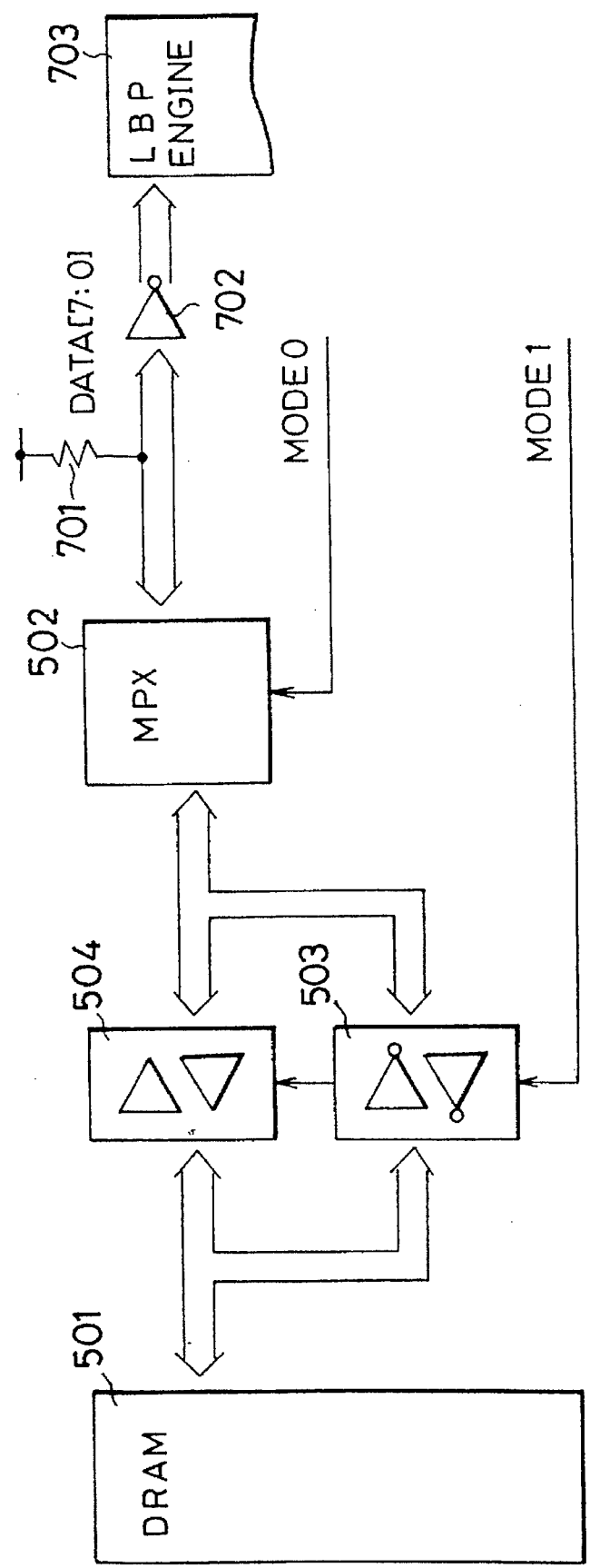
FIG. 7 is an explanatory view showing a method for transmitting data to an LBP engine in the second embodiment.

The controller shown in FIG. 7 has a pull-up resistor 701 and an inverting circuit 702. The pull-up resistor 701 pulls up output data of a multiplexer 502, i.e., output data of a DRAM 501. The inverting circuit 702 inverts the pulled-up output data. The output data of the DRAM 501 are inverted and pulled up by control of a MODE1 signal using the control section 603 when no YMC-data are read from the DRAM 501. Thereafter, these output data are again inverted by the inverting circuit 702 until a front stage of video output data transmitted to an LBP engine 703. Thus, similar to the first embodiment, white color can be provided by YMC-data when no YMC-data are read from the DRAM 501.

As mentioned above, in accordance with a first structure of the present invention, a DRAM has bus-width selecting means for selecting the width of a data bus on the basis of a mode signal for designating the bus width. In the first structure, a plurality of access methods can be used with respect to a single DRAM so that extendability of the DRAM can be improved and data of the DRAM can be accessed at a high speed.

In accordance with a second structure of the present invention, a DRAM has inverting means for inverting writing data and reading data on the basis of a mode signal for designating inversion of data. In the second structure, it is possible to cope with a situation in which logics of white data with respect to YMC (yellow, magenta, cyan) data and RGB (red, green, blue) data are reverse to each other by using a simplified structure and a short processing time.

In accordance with a third structure of the present invention, a controller has n-DRAMs each having bus-width selecting means for selecting the width of a data bus on the basis of a mode signal for designating the bus width where n is a positive integer; a first buffer for inputting and outputting data with respect to the n-DRAMs; a second buffer for inputting and outputting data with respect to the n-DRAMs; and access switching means for switching first and second access operations by controlling a setting operation of the mode signal and selection of an accessed DRAM; the controller being constructed such that bus-width full data as $2^N$ data of one DRAM among the n-DRAMs are accessed through the first buffer in the first access operation where N is a non-negative integer; and data of m-DRAMs (m≦n) extended with the data bus of each of the DRAMs as one bit are accessed through the second buffer in the second access operation where m is a positive integer. In the third structure, a plurality of access methods can be used with respect to a single DRAM so that extendability of the DRAM can be improved and data of the DRAM can be accessed at a high speed.

In accordance with a fourth structure of the present invention, a controller has DRAMs each having inverting means for inverting writing data and reading data on the basis of a mode signal for designating inversion of data; and inverting control means for writing value "0" to all the DRAMs by positive logic by controlling the mode signal when a page memory is cleared; the inverting control means processing color data by the positive logic as it is in the case of YMC and logically inverting color data in the case of RGB. In the fourth structure, it is possible to cope with a situation in which logics of white data with respect to YMC (yellow, magenta, cyan) data and RGB (red, green, blue) data are reverse to each other by using a simplified structure and a short processing time.

In accordance with a fifth structure of the present invention, a controller has a DRAM having first inverting means for inverting writing data and reading data on the basis of a mode signal for designating inversion of data; a pull-up resistor for pulling-up output data of the DRAM; second inverting means for inverting the pulled-up output data of the DRAM; and inverting control means for inverting and outputting the output data of the DRAM by controlling the mode signal when no YMC-data are read from the DRAM. In the fifth structure, it is possible to cope with a situation in which logics of white data with respect to YMC (yellow, magenta, cyan) data and RGB (red, green, blue) data are reverse to each other by using a simplified structure and a short processing time.

In accordance with a sixth structure of the present invention, a controller having n-DRAMs where n is a positive integer comprises n-bus-width selecting means respectively arranged with respect to the n-DRAMs to select the width of a data bus; a first buffer for inputting and outputting data with respect to the n-DRAMs; a second buffer for inputting and outputting data with respect to the n-DRAMs; and access switching means for switching first and second access operations by selecting the data bus width through the bus-width selecting means; the controller being constructed such that bus-width full data as $2^N$ data of one DRAM among the n-DRAMs are accessed through the first buffer in the first access operation where N is a non-negative integer; and data of m-DRAMs (m≦n) extended with the data bus of each of the DRAMs as one bit are accessed through the second buffer in the second access operation where m is a positive integer. In the sixth structure, a plurality of access methods can be used with respect to a single DRAM so that extendability of the DRAM can be improved and data of the DRAM can be accessed at a high speed.

In accordance with a seventh structure of the present invention, a controller having DRAMs comprises inverting means for inverting writing data and reading data with respect to each of the DRAMs; and inverting control means for writing value "0" to all the DRAMs by positive logic by controlling an operation of the inverting means when a page memory is cleared; the inverting control means processing color data by the positive logic as it is in the case of YMC and logically inverting color data in the case of RGB. In the seventh structure, it is possible to cope with a situation in which logics of white data with respect to YMC (yellow, magenta, cyan) data and RGB (red, green, blue) data are reverse to each other by using a simplified structure and a short processing time.

In accordance with an eighth structure of the present invention, a controller has a DRAM; first inverting means for inverting writing data and reading data with respect to the DRAM; a pull-up resistor for pulling-up output data of the DRAM; second inverting means for inverting the pulled-up output data of the DRAM; and inverting control means for inverting and outputting the output data of the DRAM by controlling an operation of the first inverting means when no YMC-data are read from the DRAM. In the eighth structure, it is possible to cope with a situation in which logics of white data with respect to YMC (yellow, magenta, cyan) data and RGB (red, green, blue) data are reverse to each other by using a simplified structure and a short processing time.

Many widely different embodiments of the present invention may be constructed without departing from the spirit and scope of the present invention. It should be understood that the present invention is not limited to the specific embodiments described in the specification, except as defined in the appended claims.

What is claimed is:

1. A controller comprising:

n-DRAMs each having bus-width selecting means for selecting the width of a data bus on the basis of a mode signal for designating the bus width, where n is a positive integer;

a first buffer for inputting data to and outputting data from said n-DRAMs;

a second buffer for inputting data to and outputting data from said n-DRAMs; and access switching means for switching first and second access operations by controlling a setting operation of said mode signal and selecting an accessed DRAM, wherein the controller is arranged such that bus-width full data ($2^N$ data) of one DRAM among said n-DRAMs are accessed through the first buffer in the first access operation, where N is a non-negative integer, and wherein data of m-DRAMs (m≦n) extended with the data bus of each of the DRAMs as one bit are accessed through the second buffer in the second access operation, where m is a positive integer.

2. A controller comprising:

DRAMs each comprising inverting means for inverting writing data and reading data based on a mode signal for designating inversion of data; and inverting control means for writing a value "0" to all of the DRAMs by positive logic, by controlling said mode signal when a page memory is cleared, wherein the inverting control means processes color data by the positive logic as it is when processing YMC and logically inverts color data when processing RGB.

3. A controller comprising;

a DRAM comprising first inverting means for inverting writing data and reading data based on a mode signal for designating inversion of data;

a pull-up resistor for pulling-up output data of said DRAM;

second inverting means for inverting said pulled-up output data of the DRAM; and inverting control means for inverting and outputting the output data of the DRAM by controlling the mode signal when no YMC-data are read from the DRAM.

4. A controller having n-DRAMs, where n is a positive integer, the controller comprising;

n-bus-width selecting means each respectively arranged with a corresponding one of said n-DRAMs to select a width of a data bus;

a first buffer for inputting data to and outputting data from said n-DRAMs;

a second buffer for inputting data to and outputting data from said n-DRAMs; and access switching means for switching first and second access operations by selecting the data bus width through said bus-width selecting means;

wherein the controller is arranged such that bus-width full data ($2^N$ data) of one DRAM among said n-DRAMs are accessed through the first buffer in the first access operation, where N is a non-negative integer; and wherein data of m-DRAMs (m≦n) extended with the data bus of each of the DRAMs as one bit are accessed through the second buffer in the second access operation, where m is a positive integer.

5. A controller having DRAMs, the controller comprising:

inverting means for inverting writing data and reading data with respect to each of said DRAMs; and inverting control means for writing a value "0" to all of the DRAMs by positive logic, by controlling an operation of said inverting means when a page memory is cleared, wherein the inverting control means processes color data by the positive logic as it is when processing YMC and logically inverts color data when processing RGB.

6. A controller comprising:

a DRAM;

first inverting means for inverting writing data and reading data with respect to said DRAM;

a pull-up resistor for pulling-up output data of said DRAM;

second inverting means for inverting said pulled-up output data of the DRAM; and inverting control means for controlling said first inverting means for inverting and outputting the output data of the DRAM when no YMC-data are read from the DRAM.

* * * * *